United States Patent

Azdasht et al.

[19]

[11] Patent Number: 6,056,188

[45] Date of Patent: May 2, 2000

[54] METHOD OF ATTACHING A COMPONENT TO A PLATE-SHAPED SUPPORT

[75] Inventors: Ghassem Azdasht; Paul Kasulke, both of Berlin, Germany

[73] Assignee: Pac Tech-Packaging Technologies GmbH, Nauem, Germany

[21] Appl. No.: 09/076,273

[22] Filed: May 12, 1998

[30] Foreign Application Priority Data

May 12, 1997 [DE] Germany ............................. 197 19 860
Oct. 21, 1997 [DE] Germany ............................. 197 46 408

[51] Int. Cl.[7] ............................. B23K 31/00; B23K 31/02
[52] U.S. Cl. ...................................... 228/179.1; 228/180.1
[58] Field of Search ............................... 228/179.1, 180.1

[56] References Cited

U.S. PATENT DOCUMENTS

| | | | |
|---|---|---|---|
| 4,799,755 | 1/1989 | Jones | 350/96.18 |
| 5,055,652 | 10/1991 | Jones et al. | 219/121.64 |
| 5,438,579 | 8/1995 | Eda et al. | 372/34 |
| 5,481,082 | 1/1996 | Yamamoto | 219/121.63 |

FOREIGN PATENT DOCUMENTS 42 00492A1  4/1993  Germany .
4-260387    9/1992  Japan .

OTHER PUBLICATIONS

Somasiri, N. et al, "A Process for Surface Texturing of Kapton Polyimide to Improve Adhesion to Metals", 798–801; Dec. 1991, IEEE, vol. 14, No. 4.

*Primary Examiner*—Patrick Ryan
*Assistant Examiner*—Zidia T. Pittman
*Attorney, Agent, or Firm*—Wolf, Greenfield & Sacks, P.C.

[57] ABSTRACT

A method of attaching an electronic component to a surface of a plate-shaped support member has as a first step the step of applying the electronic component to the surface of the support member, a solder being arranged between the electronic component and the support member. Following this, a glass fiber or a glass fiber bundle is applied to the surface of the plate-shaped support member located opposite the electronic component. Finally, a laser pulse is conducted through the glass fiber or glass fiber bundle for melting the solder so as to establish a punctiform electrical and mechanical connection between the support member and the electronic component in this way.

12 Claims, 2 Drawing Sheets

METHOD OF ATTACHING A COMPONENT TO A PLATE-SHAPED SUPPORT

BACKGROUND OF THE INVENTION

1. Field of the Invention

The present invention refers to a method of attaching an electronic component to a surface of a platelike support member.

2. Description of the Related Art

Bonding methods such as e. g. thermode bonding, thermo-compression bonding as well as ultrasonic welding, are known as methods of attaching an electronic component, e.g. a laser bar, to the surface of a plate-shaped support member. Such methods are e.g. suitable for attaching laser diodes to the copper coating of a copper-coated Kapton foil in such a way that a conductive connection is established. These known methods result in a planar connection between the laser diode and the copper. The connection method therefore entails thermal loads in the laser diode due to different co-efficients of thermal expansion, the thermal loads adding up over the whole planar connection area.

SUMMARY OF THE INVENTION

It is the object of the present invention to provide a new, time-saving method of attaching an electronic component to a surface of a plate-shaped support member in the case of which the component is only subjected to minor thermal loads.

According to a general aspect, the present invention provides a method of attaching an electronic component to a surface of a plate-shaped electrically conductive support member, where the method includes: applying the electronic component to the surface of the support member, a solder being arranged between the electronic component and the support member; applying a plurality of glass fibers or a plurality of glass fiber bundles to the surface of the plate-shaped support member located opposite the electronic component; and conducting laser pulses through the plurality of glass fibers or glass fiber bundles for melting the solder so as to establish a plurality of separate punctiform electrical and mechanical connections between the support member and the electronic component for providing one power supply path to the electronic component.

According to another general aspect, the present invention provides a method of attaching an electronic component to a surface of a plate-shaped electrically conductive support member, where the method includes: applying the electronic component to the surface of the support member, a solder being arranged between the electronic component and the support member, applying a glass fiber or a glass fiber bundle to the surface of the plate-shaped support member located opposite the electronic component; conducting a laser pulse through the glass fiber or glass fiber bundle for melting the solder so as to establish a punctiform electrical and mechanical connection between the support member and the electronic component; and repeating the two previous steps in order to establish a plurality of separate punctiform electrical and mechanical connections between the support member and the electronic component for providing one power supply path to the electronic component.

The methods according to the present invention are preferably suitable for attaching a laser diode to the copper coating of a copper-coated Kapton foil. Kapton®, a trademark of E. I. du Pont de Nemours and Company ("Dupont"), refers to a polyimide film manufactured and sold by Dupont. The Kapton foil is preferably removed at the point of connection. For achieving a reliable fastening of the laser diode, the laser diode is preferably attached to opposed surfaces of the Kapton foil to such a copper coating so that the laser diode is arranged between two copper coatings.

The methods according to the present invention produce a thermal load for the component to be attached only at the punctiform location of joining or at a plurality of punctiform locations of joining which are determined by the position of the glass fiber or glass fiber bundle or by the positions of a plurality of glass fibers or glass fiber bundles. It follows that, in the case of the methods according to the present invention, the thermal load will not add up over the whole surface of the component, this being the case with known methods, e.g. methods making use of a thermode. When the punctiform fastening according to the present invention is effected, the copper, for example, will warm up only locally; hence, the copper will not undergo planar expansion and, consequently, it will not subject the component to any thermal loads during subsequent cooling down.

By means of the methods according to the present invention, a plurality of punctiform joining points can be produced in temporal succession or simultaneously in parallel making use of a corresponding number of glass fibers or glass fiber bundles, the parallel production being advantageous in view of the time saved in this way.

Unlike thermode bonding, where the thermode is heated, the methods according to the present invention do not include the step of heating the glass fiber or glass fiber bundle so that the resultant thermal loads will be lower. Furthermore, it is not necessary to apply any pressure, and this will reduce the mechanical loads as well.

BRIEF DESCRIPTION OF THE DRAWINGS

In the following, preferred embodiments of the present invention will be explained in more detail making reference to the drawings enclosed, in which.

DESCRIPTION OF THE PREFERRED EMBODIMENTS

Figure 1:
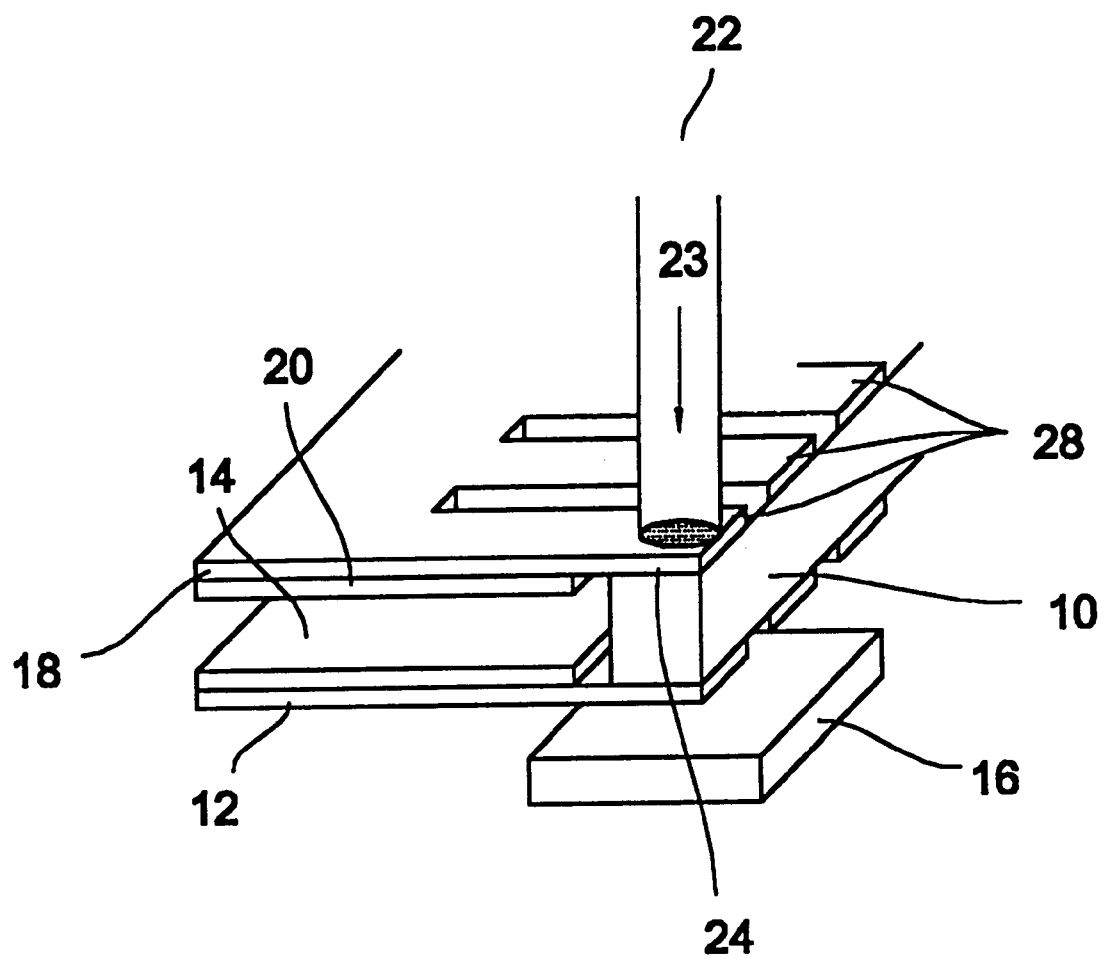
FIG. 1 shows a schematic representation for illustrating the method according to the present invention.

Making reference to FIG. 1, the method according to the present invention is first of all explained in more detail. It is pointed out that, in the drawings, identical reference numerals have been used for identical elements.

In FIG. 1, a laser diode 10 is shown, the surface of the laser diode constituting the lower surface in FIG. 1 being already attached to the copper coating 12 of a copper-coated Kapton foil 14. For carrying out the method according to the present invention, this arrangement consisting of the laser diode attached to the copper-coated Kapton foil can be placed e.g. onto a support surface 16. The laser diode 10 now is to be attached to a further copper-coated Kapton foil.

For this purpose, the laser diode 10 is applied to the copper coating 18 of a further copper-coated Kapton foil 20 in the manner shown, i.e. the laser diode 10 is applied to a surface of the copper coating 18 which faces the Kapton foil 20, the Kapton foil being removed in the area of application so that the laser diode 10 abuts on the copper coating. Before the laser diode 10 is applied, the laser diode areas to be connected and/or the areas of the copper coating 18 to be connected are provided with a solder in such a way that, when the laser diode 10 has been applied to the copper coating 18, a solder is arranged between these two components. The additional provision of the solder is, of course, not necessary when the laser diode is pretinned.

In order to establish a connection between the copper coating 18 and the laser diode 10, a glass fiber or a glass fiber bundle 22 is applied to the copper coating 18 at one end of the location of joining 24. Following this, a laser pulse 23 is conducted through the glass fiber so as to melt the solder located between the laser diode and the copper coating and establish an electrical and mechanical connection between the laser diode 10 and the copper coating 18. When the solder is attached to the laser diode 10, it will wet the copper of the Kapton foil in the course of the process described hereinbefore and establish the described connection in this way.

Figure 2:
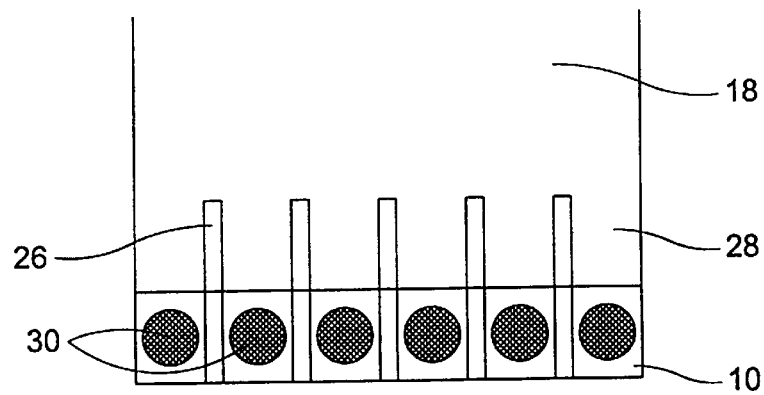
FIG. 2 shows a top view of an arrangement consisting of a copper-coated Kapton foil and of a laser diode which has been attached to the copper-coated Kapton foil in accordance with the method according to the present invention.

As can be seen in FIG. 1 and, in addition, also in the top view of FIG. 2, the copper-coated Kapton foil 20 according to the embodiment shown is provided with slots 26 in the marginal area in which the laser diode 10 is secured thereto, the slots 26 being provided for defining fingers 28. These fingers secure copper leads in position, the power supply to the laser diode taking place via the copper leads during operation. This configuration additionally permits a small amount of heat to be dissipated from the laser diode 10 via the fingers 28. Furthermore, the finger structure shown permits a compensation of thermal expansions between the Kapton foil 20 and the laser diode 10. It is, however, obvious that a continuous copper foil may also be used for the leads.

The laser diode 10 is connected to each of the fingers 28 in accordance with the method according to the present invention. For this purpose, the method according to the present invention is carried out for each finger. In the top view of FIG. 2, in which, for the sake of clarity, the laser diode 10 is represented by thick lines although the laser diode 10 is arranged below the fingers 28, the resultant joining points 30 are shown. These joining points can be produced either in temporal succession or simultaneously in parallel. The parallel production permits a faster joining process, but necessitates a more complicated equipment so that the punctiform connection points between the laser diode and the copper foil can be established simultaneously; the laser diode must be provided with a correspondingly large number of suitably spaced glass fibers or glass fiber bundles. In any case, a suitable holder can be provided for the glass fibers or the glass fiber bundles; the holder may consist of different metallic and non-metallic materials, such as glass or silicon.

The configuration of a laser diode 10 which is arranged between two copper-coated Kapton foils and which is shown in FIG. 1 is obtained when the laser diode 10 is attached to the copper fingers of both copper-coated Kapton foils by means of the method according to the present invention. The present invention thus provides a time-saving method for reliably attaching e.g. a laser diode to plate-shaped support members, e.g. the copper coating of a copper-coated Kapton foil, without subjecting the laser diode to high thermal loads.

In view of the disadvantageous heat dissipation via the fingers 28, the structural design which has been described hereinbefore and which results from the method according to the present invention only permits a pulsed operation of the laser diode 10. In order to permit a continuous operation of the laser diode 10, it will therefore be advantageous to provide a cooling means on the arrangement. Such a cooling means provided on the arrangement is shown in FIG. 3.

Figure 3:
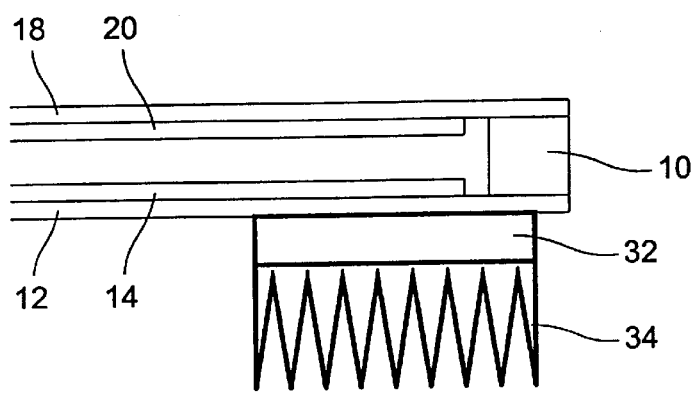
FIG. 3 shows a schematic representation for illustrating the method according to the present invention for attaching a laser diode and, in addition, for attaching a Peltier element.

FIG. 3 shows a laser diode 10 which is attached to the copper coatings 12 and 18 of two copper-coated Kapton foils 14 and 20 in the manner described hereinbefore. In order to improve heat dissipation, a Peltier element 32 can now be attached to one of the copper coatings, in the representation according to FIG. 3 the copper coating 12. Also the Peltier element 32 can be attached to the copper coating 12 by the FPC connection method (FPC=Fiber Push Connection) according to the present invention. In so doing, the Peltier element 32 is attached to the surface of the copper coating 12 located opposite the laser diode 10. The surface of the Peltier element 32 facing away from the copper coating 12 can then have attached thereto a cooling means 34 in the usual way.

For mounting the laser diode 10 as well as the Peltier element 32 in the form shown in FIG. 3, an advantageous mounting sequence should be chosen. In this connection, it will be advantageous when the laser diode 10 is first applied to the copper coating 12 of the lower Kapton foil 14. Subsequently, the Peltier element 32 is applied to the copper coating 12 of the lower Kapton foil 14. Finally, the laser diode 10 is then attached to the copper coating 18 of the upper Kapton foil 20. The structural design shown in FIG. 3 is obtained in this way.

What is claimed is:

1. A method of attaching an electronic component to a surface of a plate-shaped electrically conductive support member, said method comprising the following steps:

a) applying the electronic component to the surface of said support member, a solder being arranged between said electronic component and said support member;

b) applying a plurality of glass fibers or a plurality of glass fiber bundles to the surface of said plate-shaped support member located opposite said electronic component; and c) conducting laser pulses through said plurality of glass fibers or glass fiber bundles for melting the solder so as to establish a plurality of separate punctiform electrical and mechanical connections between the support member and the electronic component for providing one power supply path to the electronic component.

2. A method according to claim 1, wherein a laser diode is used as an electronic component and a copper-coated polyimide foil is used as a support member, said laser diode being applied to a surface of the copper coating of said copper-coated polyimide foil which faces the polyimide foil, said polyimide foil being removed at the point of application.

3. A method according to claim 2, comprising after step c) the step of applying the surface located opposite the surface which has been attached to the support member to a further support member making use of steps a) to c).

4. A method according to claim 2, wherein the laser diode is applied to the margin of the copper-coated polyimide foil, said copper-coated polyimide foil being provided with slots in this area in such a way that the laser diode is applied to a plurality of projecting fingers of the copper coating, each of said fingers being connected to the laser diode in accordance with steps b) and c).

5. A method according to claim 1, wherein a Peltier element is used as an electronic component, said Peltier element being attached to the copper coating of a copper-coated polyimide foil in accordance with steps a) to c).

6. A method according to claim 2, wherein, when the laser diode has been attached to one or to two support members, a Peltier element is applied in the area of the laser diode to the surface of the copper coating facing away from said laser diode, a cooling body being subsequently applied to the Peltier element.

7. A method of attaching an electronic component to a surface of a plate-shaped electrically conductive support member, said method comprising the following steps:
   a) applying the electronic component to the surface of said support member, a solder being arranged between said electronic component and said support member;
   b) applying a glass fiber or a glass fiber bundle to the surface of said plate-shaped support member located opposite said electronic component;
   c) conducting a laser pulse through said glass fiber or glass fiber bundle for melting the solder so as to establish a punctiform electrical and mechanical connection between the support member and the electronic component; and
   d) repeating steps b) and c) in order to establish a plurality of separate punctiform electrical and mechanical connections between the support member and the electronic component for providing one power supply path to the electronic component.

8. A method according to claim 7, wherein a laser diode is used as an electronic component and a copper-coated polyimide foil is used as a support member, said laser diode being applied to a surface of the copper coating of said copper-coated polyimide foil which faces the polyimide foil, said polyimide foil being removed at the point of application.

9. A method according to claim 8, comprising after step d) the step of applying the surface located opposite the surface which has been attached to the support member to a further support member making use of steps a) to d).

10. A method according to claim 8, wherein the laser diode is applied to the margin of the copper-coated polyimide foil, said copper-coated polyimide foil being provided with slots in this area in such a way that the laser diode is applied to a plurality of projecting fingers of the copper coating, each of said fingers being connected to the laser diode in accordance with steps b) and c).

11. A method according to claim 7, wherein a Peltier element is used as an electronic component, said Peltier element being attached to the copper coating of a copper-coated polyimide foil in accordance with steps a) to d).

12. A method according to claim 8, wherein, when the laser diode has been attached to one or to two support members, a Peltier element is applied in the area of the laser diode to the surface of the copper coating facing away from said laser diode, a cooling body being subsequently applied to the Peltier element.

* * * * *